United States Patent
Tuers et al.

(10) Patent No.: US 9,558,847 B2
(45) Date of Patent: Jan. 31, 2017

(54) DEFECT LOGGING IN NONVOLATILE MEMORY

(71) Applicant: SanDisk Technologies LLC, Plano, TX (US)

(72) Inventors: Daniel Tuers, Kapaa, HI (US); Abhijeet Manohar, Karnataka (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/550,290

(22) Filed: Nov. 21, 2014

(65) Prior Publication Data

US 2016/0148708 A1    May 26, 2016

(51) Int. Cl.
| | |
|---|---|
| G11C 29/00 | (2006.01) |
| G11C 29/38 | (2006.01) |
| G11C 29/42 | (2006.01) |
| G11C 29/44 | (2006.01) |
| G11C 16/00 | (2006.01) |

(52) U.S. Cl.
CPC ............ *G11C 29/38* (2013.01); *G11C 29/42* (2013.01); *G11C 29/44* (2013.01); *G11C 16/00* (2013.01)

(58) Field of Classification Search
CPC ................................ G11C 29/38; G11C 29/42
See application file for complete search history.

(56) References Cited

U.S. PATENT DOCUMENTS

| | | | |
|---|---|---|---|
| 2010/0058125 A1* | 3/2010 | Chen | G06F 11/1048 714/704 |
| 2010/0122019 A1 | 5/2010 | Flynn et al. | |
| 2012/0144249 A1 | 6/2012 | Franceschini et al. | |
| 2012/0281479 A1 | 11/2012 | Kochar et al. | |
| 2013/0151912 A1 | 6/2013 | Sevugapandian | |
| 2014/0269109 A1* | 9/2014 | Kong | G11C 29/04 365/189.07 |
| 2015/0067415 A1* | 3/2015 | Miyamoto | G06F 11/076 714/704 |
| 2015/0143185 A1* | 5/2015 | Motwani | G06F 11/1048 714/718 |

* cited by examiner

*Primary Examiner* — April Y Blair
*Assistant Examiner* — Thien D Nguyen
(74) *Attorney, Agent, or Firm* — Stoel Rives LLP

(57) ABSTRACT

A method of operating a nonvolatile memory block includes reading data from physical units in the block and determining individual error rates for data from the physical units. The error rate data is stored. This is repeated over multiple iterations and aggregated stored error rates are used to identify bad physical units in the block.

22 Claims, 19 Drawing Sheets

Programming into four states represented by a 2-bit code

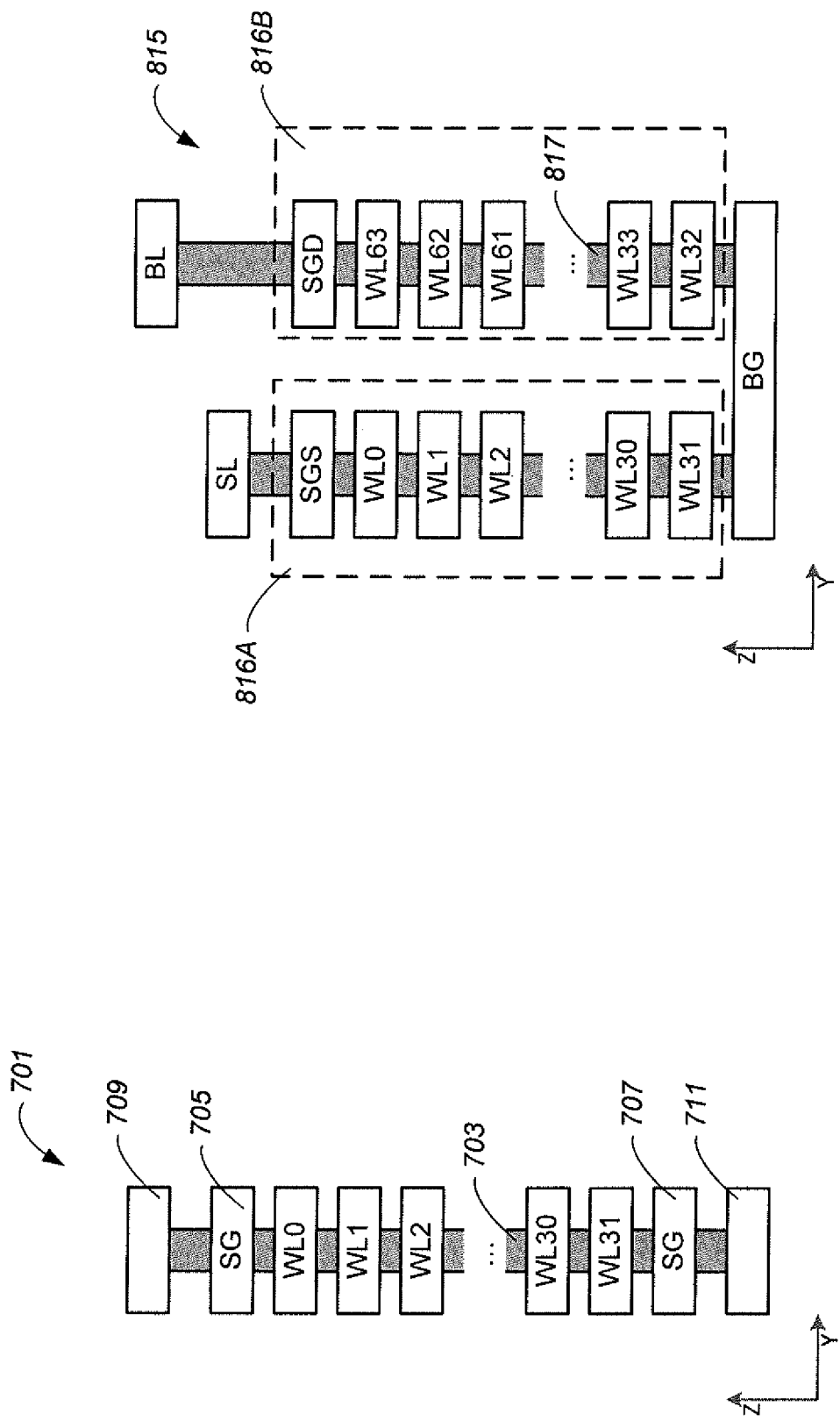

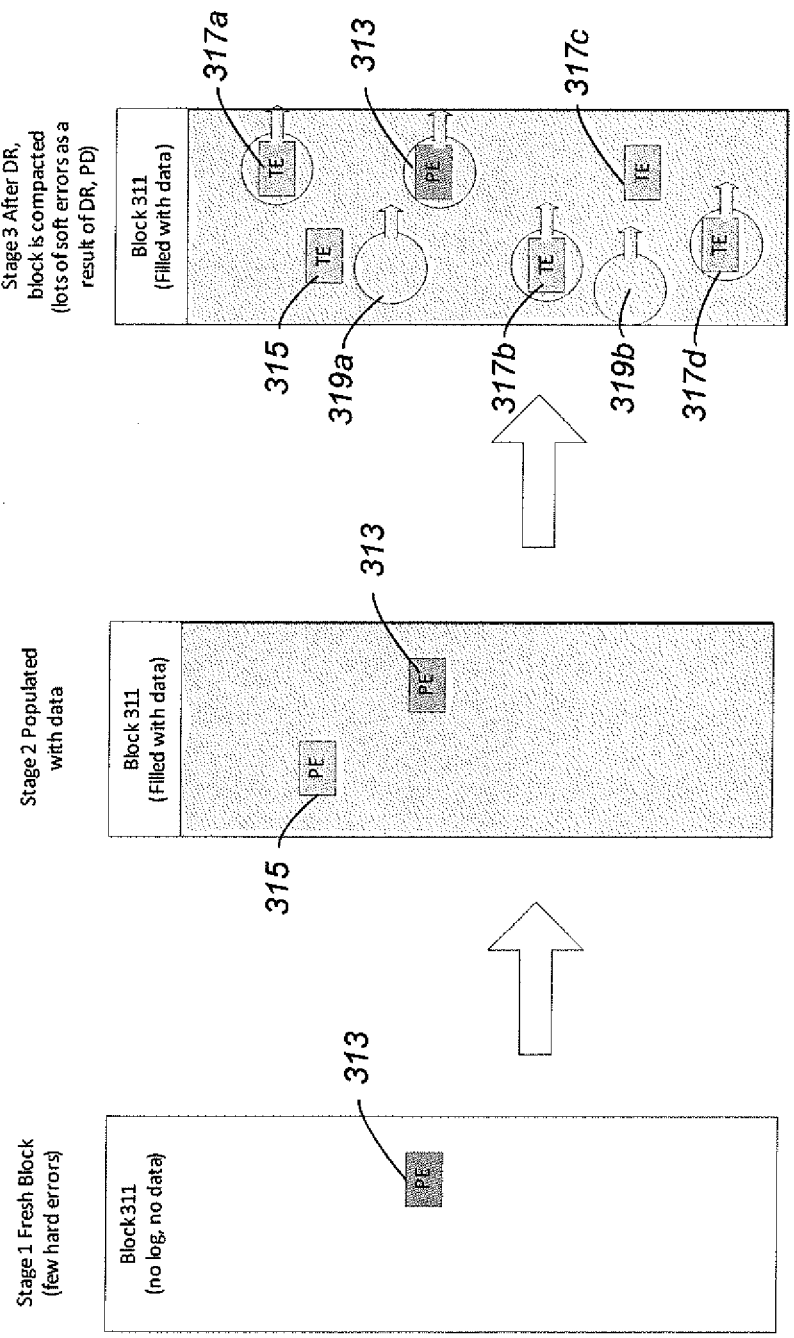

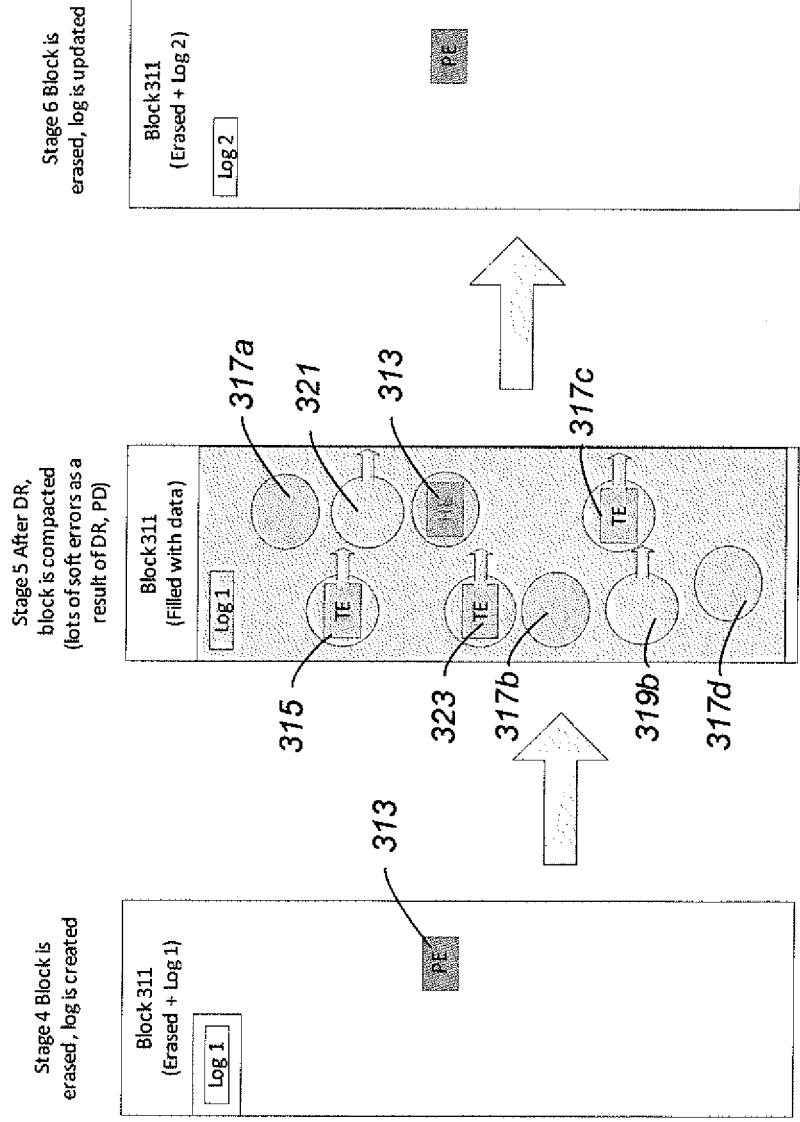

Error Log 421

|  | Unit A | Unit F | Unit K | Unit X |
|---|---|---|---|---|
| Read 0 |  | 25 | 16 |  |
| Read 1 | 15 | 6 | 11 |  |
| Read 2 | 19 | 7 | 15 | 21 |

*FIG. 14*

DEFECT LOGGING IN NONVOLATILE MEMORY

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

In some cases, defects occur in nonvolatile memories causing errors in stored data when the data is read out. Small numbers of errors can generally be corrected by Error Correction Code (ECC). Large numbers of errors may be uncorrectable by ECC (UECC). Even when errors are correctable, such correction may require significant resources and may take significant time.

SUMMARY

In some memory systems, physical defects may affect portions of a block while other portions of the block are unaffected. Detecting such physical defects efficiently may allow improved block operation. Data with a high error rate may sometimes indicate a physical defect but in some cases data may have a high error rate even though the area from which it is read is a good area. To distinguish when high error rates are the result of a physical defect, error rates are logged over a number of write-erase cycles and the aggregated error rates are used to identify areas with persistently high error rates. If a physical area has a high error rate in a given cycle but otherwise has an acceptable error rate then the high error rate may be dismissed as a transient error. If a physical area has a high error rate over multiple write-erase cycles then the condition may be considered to be persistent and the physical area may be considered to be physically defective. Appropriate action may then be taken such as designating the physical area as a bad area that is not to be used for subsequent storage of user data. An error log may be maintained in a block to log error rates for physical areas that show high error rates so that aggregated error rates can be analyzed.

An example of a method of operating an individually erasable block in a nonvolatile memory system includes: (a) writing data in a plurality of physical units in the individually erasable block; (b) subsequently, reading the data from the plurality of physical units in the individually erasable block and determining individual error rates for data from the plurality of physical units; (c) erasing the individually erasable block; (d) storing the individual error rates; (e) subsequently repeating steps (a)-(d) in one or more additional iterations; and (f) identifying one or more physical units in the individually erasable block as bad and not for subsequent storage of user data, the bad physical units identified by aggregating stored individual error rates from two or more iterations of steps (a)-(d).

An individual physical unit may store an amount of data that is equal to the amount of data that is individually encoded and decoded by an Error Correction Code (ECC) scheme of the nonvolatile memory system. The individual error rates may be stored only for physical units that have error rates that exceed a threshold value. Step (d) storing the individual error rates may include writing the individual error rates in the individually erasable block after step (c) erasing the individually erasable block. The method may also include: (g) identifying one or more additional physical units in the individually erasable block as suspect units by aggregating stored individual error rates of two or more iterations of steps (a)-(d). Testing may be performed on the suspect units, the testing including writing test data and reading the test data. Prior to folding data of the individually erasable block with one or more other individually erasable blocks, it may be determined if the one or more other individually erasable blocks contain suspect units and it may be ensured that uncorrected data from a suspect unit in the individually erasable block is not folded together with uncorrected data from a suspect unit in the one or more other individually erasable block. The ensuring may include performing Error Correction Code (ECC) correction on at least some of the data from suspect units prior to folding. The nonvolatile memory system may include a plurality of individually erasable blocks and the individually erasable block may be selected for step (d) storing the individual error rates, in response to a determination that the individually erasable block has a block error rate above a limit. Step (d) storing the individual error rates, may not be performed for any physical units in other individually erasable blocks of the plurality of individually erasable blocks that have error rates below the limit.

An example of a method of operating a plurality of monitored blocks in a nonvolatile memory system includes: maintaining individual error maps for each of the plurality of monitored blocks; identifying two or more monitored blocks of the plurality of monitored blocks for a block folding operation; analyzing individual error maps for the two or more monitored blocks to select a block folding scheme according to the individual error maps from two or more block folding schemes including at least: (a) on-chip block folding without Error Correction Code (ECC) correction of data and (b) off-chip block folding with ECC correction; and subsequently performing the block folding operation using the selected block folding scheme.

On-chip block folding without ECC correction may be selected in response to determining that errors for the two or more blocks are not overlapping and that overall error rates of the two or more blocks are below a threshold. Off-chip block folding with ECC correction may be selected in response to determining that errors for the two or more monitored blocks overlap or that overall error rates are above a threshold. The error maps for the two or more monitored blocks may be updated according to results of the ECC correction. The nonvolatile memory system may include unmonitored blocks for which no individual error maps are maintained. The method may include designating a previously unmonitored block as a monitored block in response to a determination that a number of errors in the previously unmonitored block exceeds a predetermined number. Maintaining the individual error maps may include accumulating error data for the plurality of monitored blocks over a plurality of write-erase cycles and storing each of the individual error maps in corresponding monitored blocks.

An example of a block erasable nonvolatile memory system includes: a plurality of monitored blocks having error rates above a threshold; an individual monitored block containing an error log that records error data for a plurality of physical areas of the individual monitored block for a plurality of write-erase cycles of the individual monitored block; and a persistent error identification circuit that identifies physically defective areas of the individual monitored block from the error log.

The error log may contain entries for only physical areas of the block that have error rates above a threshold. There may be unmonitored blocks having error rates below the threshold. The system may include a testing circuit that performs testing on physical areas of the block for which the error log indicates a high error rate. The system may include an Error Correction Code (ECC) circuit, and data may be folded from two or more source blocks into a destination block either using or not using the ECC circuit according to a determination based on data in the error logs of the source blocks.

Various aspects, advantages, features and embodiments are included in the following description of exemplary examples thereof, which description should be taken in conjunction with the accompanying drawings.

BRIEF DESCRIPTION OF THE DRAWINGS

FIG. 7 shows an example of a physical structure of a 3-D NAND string.

FIG. 8 shows an example of a physical structure of a U-shaped 3-D NAND string.

FIGS. 13A-F show an example of error logging.

FIG. 14 shows an example of an error log.

DETAILED DESCRIPTION

Memory System

Figure 1:
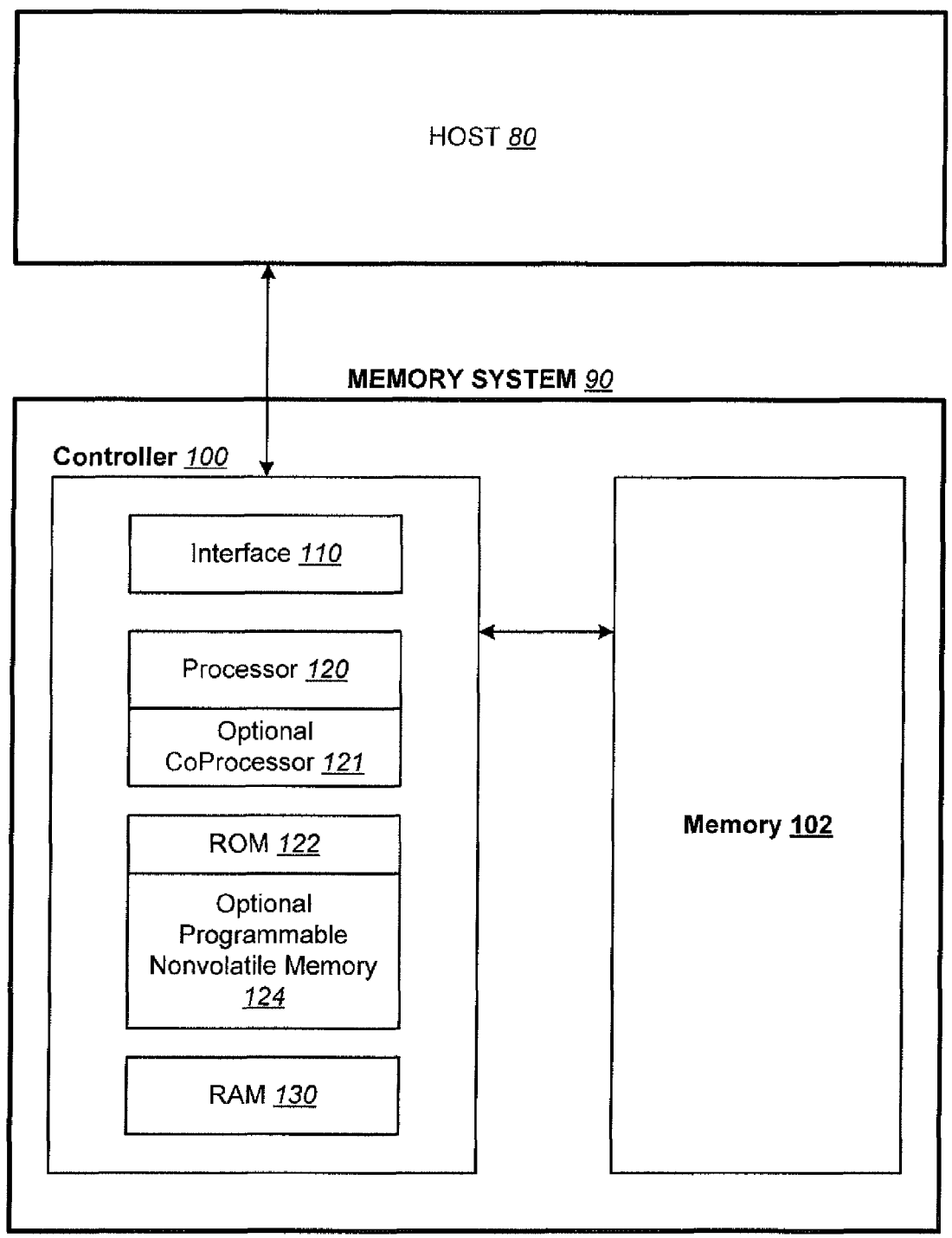
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
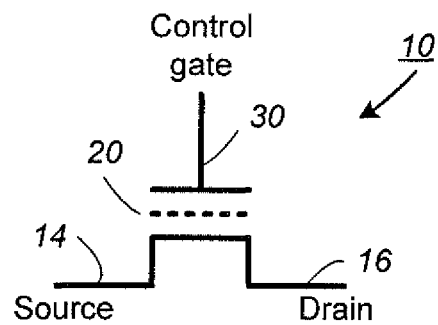
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
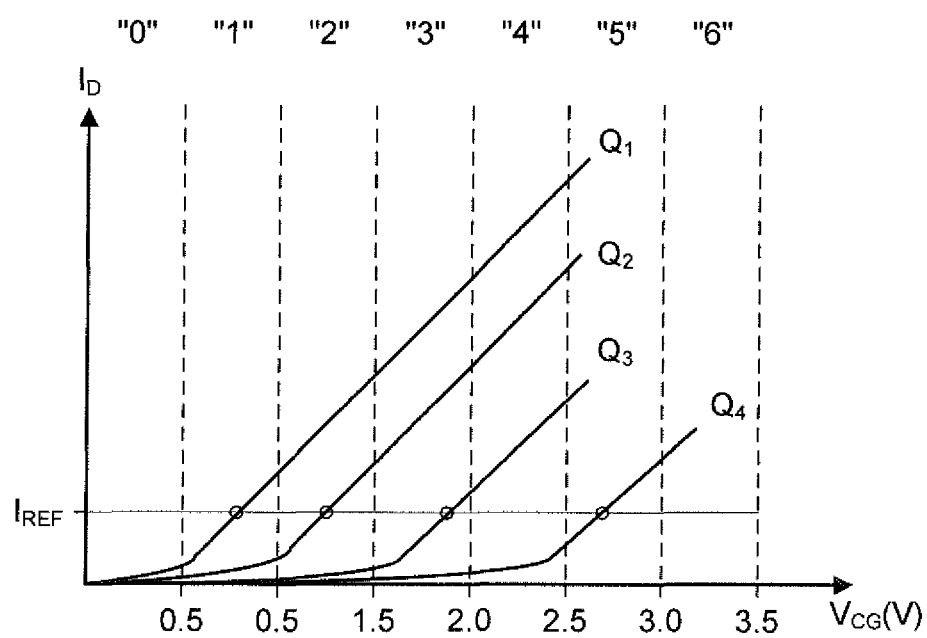
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{ca}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
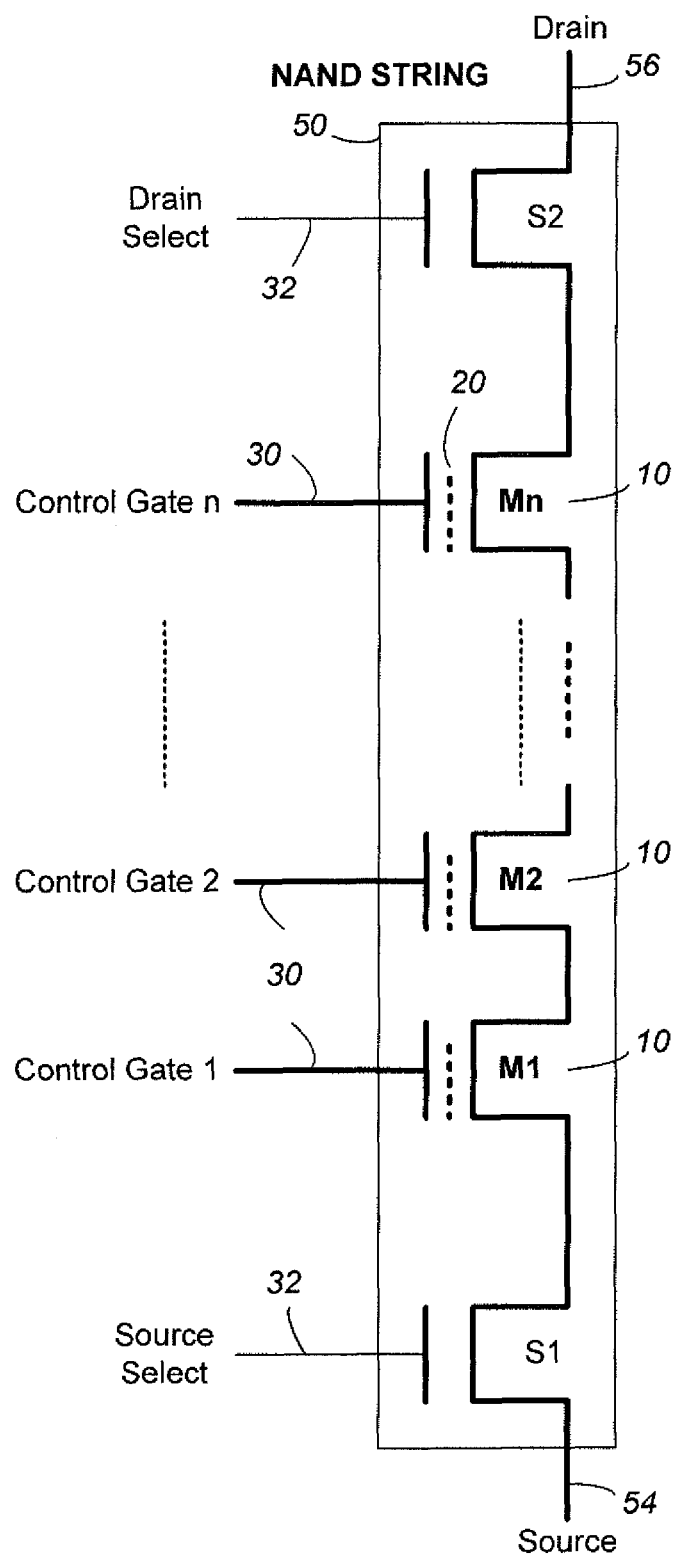
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
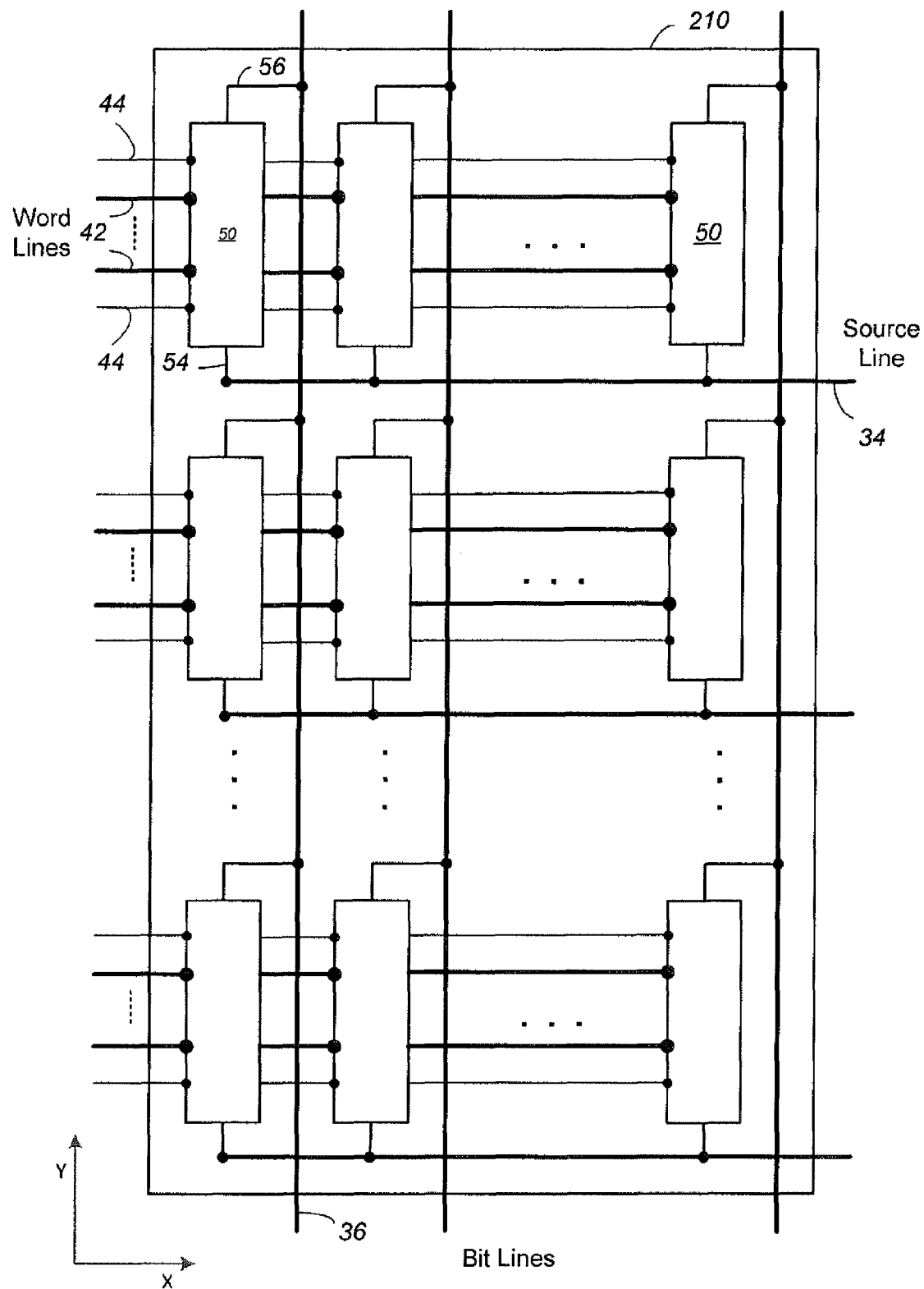
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
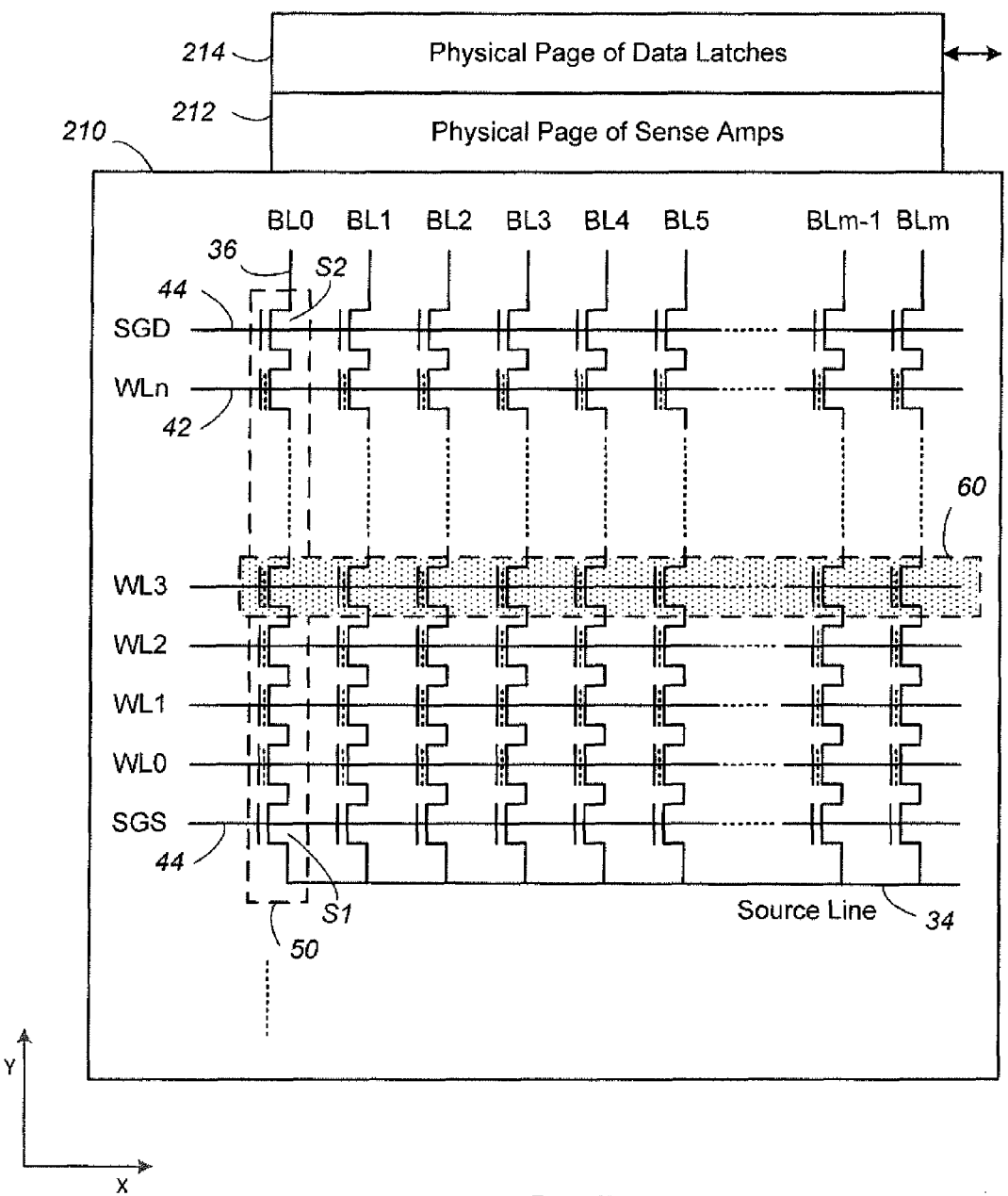
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

Figure 6A:
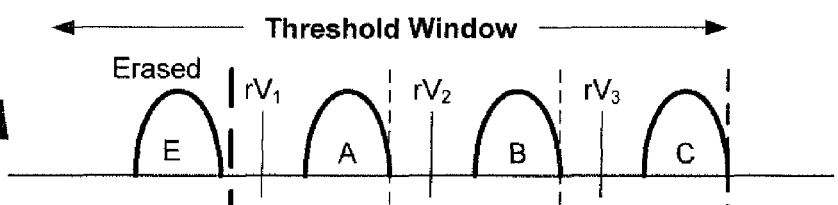
FIGS. 6A-6C illustrate an example of programming a population of memory cells.
Figure 6B:
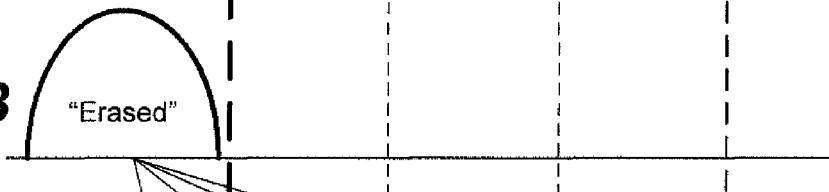
Figure 6C:
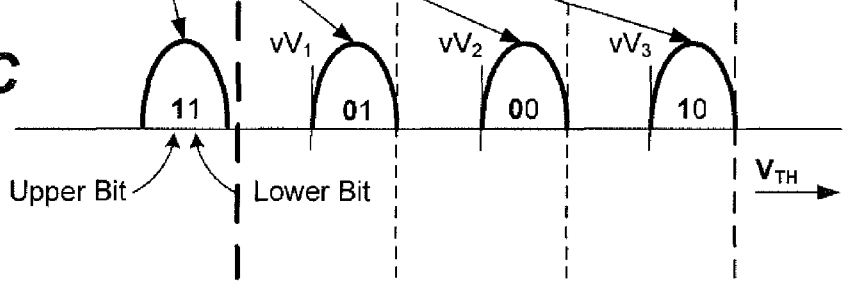

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
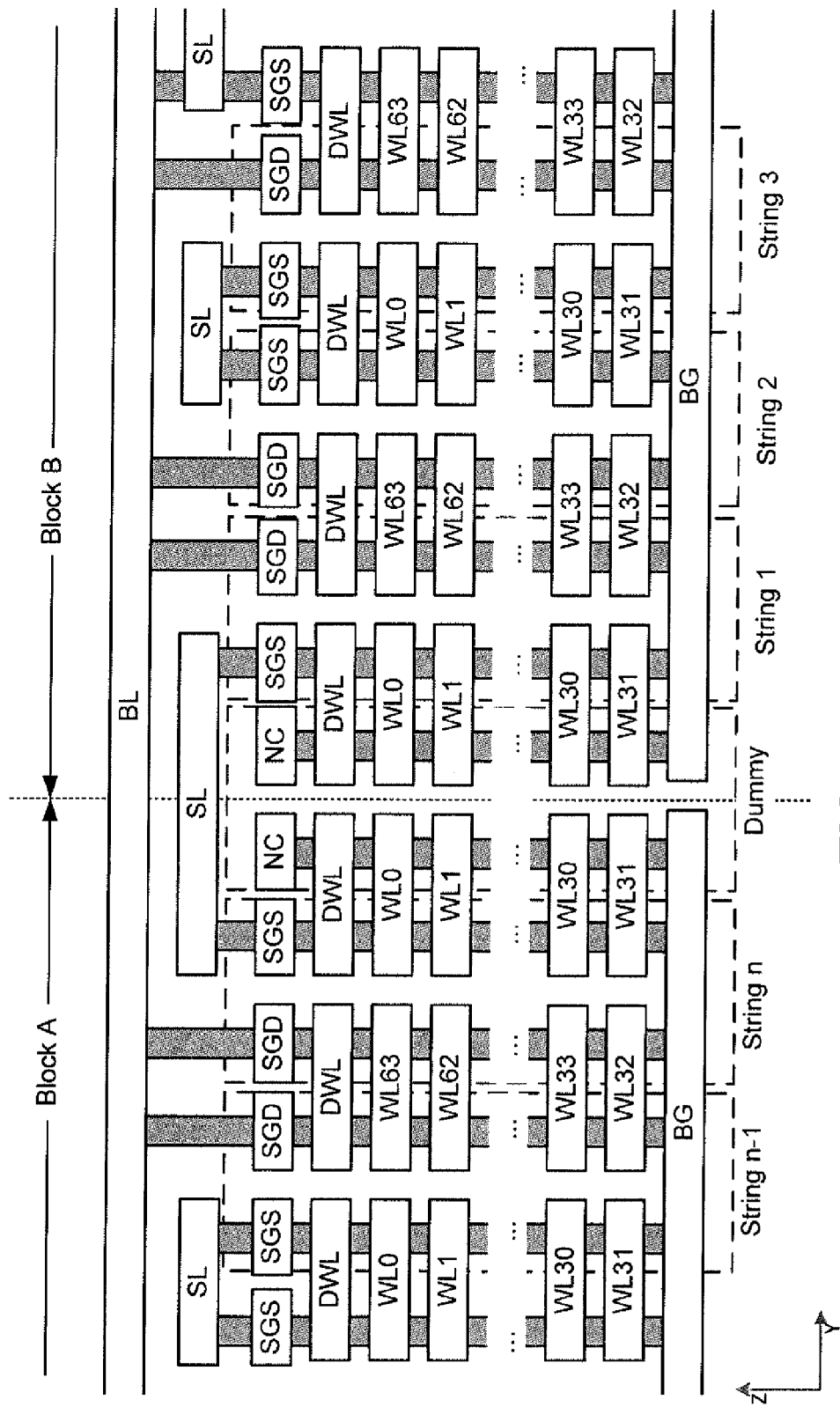
FIG. 9 shows a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10:
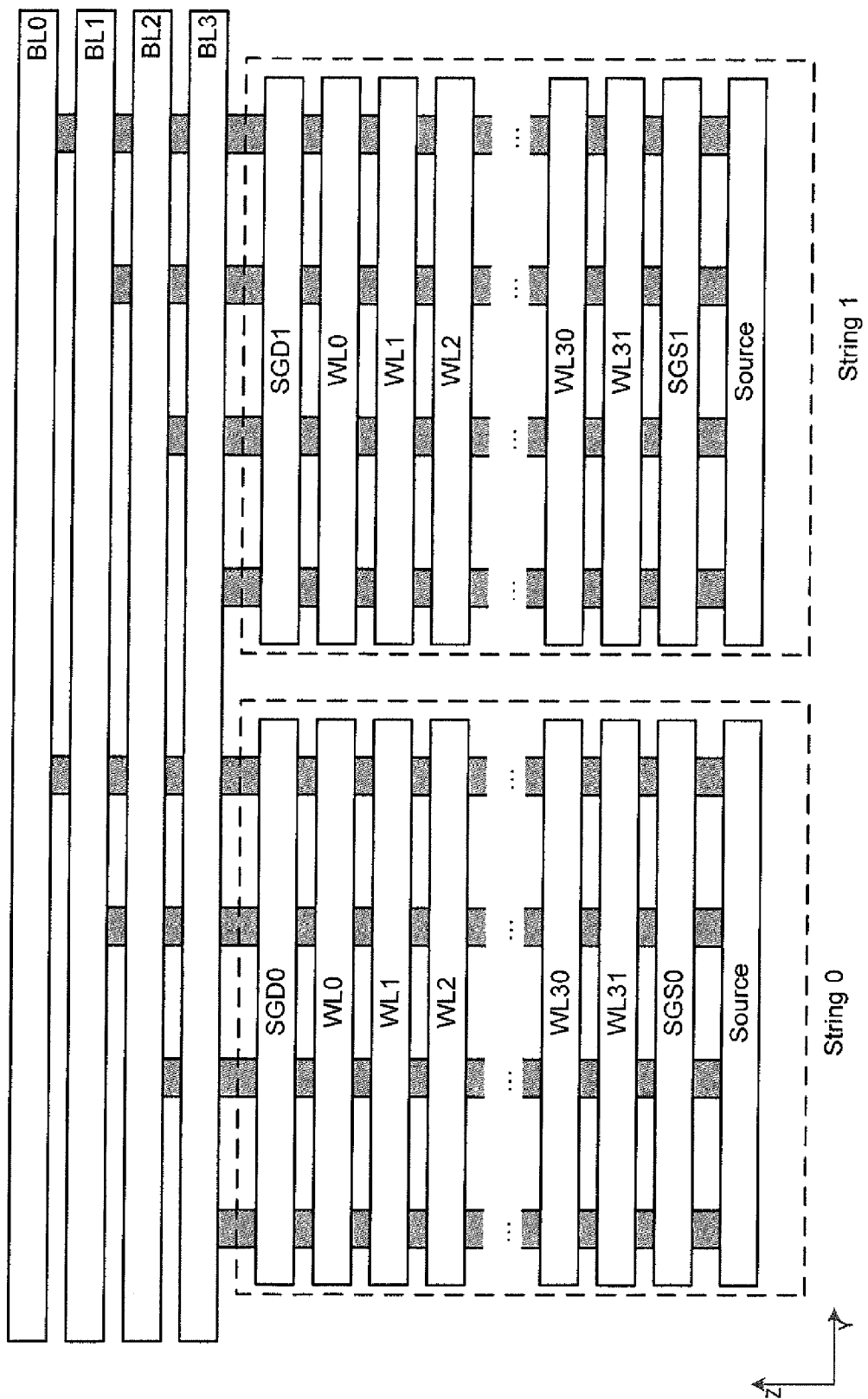
FIG. 10 shows a cross section of a 3-D NAND memory with straight NAND strings in the y-z plane.

FIG. 10 shows a memory structure in which straight vertical NAND strings extend from common source connections in or near a substrate to global bit lines (BL0-BL3) that extend over the physical levels of memory cells. Word lines in a given physical level in a block are formed from a sheet of conductive material. Memory hole structures extend down through these sheets of conductive material to form memory cells. Within a given block there are multiple NAND strings connected to a given bit line. NAND strings are grouped into sets of strings that share common select gates. Thus, for example, NAND strings that are selected by SGS0 and SGD0 may be considered a set and may be designated as String 0, while NAND strings that are selected by SGS1 and SGD1 may be considered as a set and may be designated as String 1 as shown. A block may consist of any suitable number of such sets of strings. It will be understood that the cross-section of FIG. 10 shows portions of BL0-BL3, these bit lines extend further in the y-direction. Furthermore, additional bit lines extend parallel to BL0-BL3 (e.g. at different locations along x-axis, in front of, or behind the location of the cross-section of FIG. 10). Other three dimensional memories are based on resistive elements rather than charge storage elements.

Data Errors

When data is stored in a nonvolatile memory (e.g. 2D or 3D charge storage memory) for a period of time and then read out, some errors may occur in the data. Errors may occur for a variety of reasons including read disturb (i.e. the effects of reading the data and/or reading nearby data) or data retention issues (e.g. charge leaking from floating gates). The root causes of errors may be some physical defects in the memory structure resulting from the manufacturing process, some environmental effect, data pattern effect, or some other cause. In many cases, such errors may be corrected by Error Correction Code (ECC). However, if there are many errors in a portion of data then it may require significant time and resources to perform ECC correction. If the number of errors exceeds the limit of the ECC scheme then the data may be uncorrectable by ECC (UECC) and some other approach may be used to recover the data (e.g. high resolution read). However, such approaches generally require significant time and resources. If alternative approaches fail then data may be lost. If a particular block has a high number of errors then the block may be designated as a bad block and may be discarded (i.e. no longer used for storage of user data).

In general it is desirable to avoid discarding blocks unnecessarily because of the loss of memory capacity. In some cases, a block may be discarded because of a high error rate even when most of the block is still usable (i.e. high error rate may be caused by a relatively small portion of the block). Instead of discarding such blocks, certain portions may be determined to be bad and may be discarded while the rest of the block continues to be used. Overall error rates in a block may be reduced below a threshold for bad blocks by mapping out certain areas that persistently produce high error rates. In some cases the condition of a block ("block health") is monitored and operation of the block is adjusted according to its condition. A block may appear to be in poor condition because of a small number of portions with high error rates even though other portions of such blocks may be operating well. Modifying operation of such blocks to reflect their apparently poor condition may mean operating them in a limited way that impacts overall memory operation. Mapping out portions that have high error rates may improve block operation.

Figure 11:
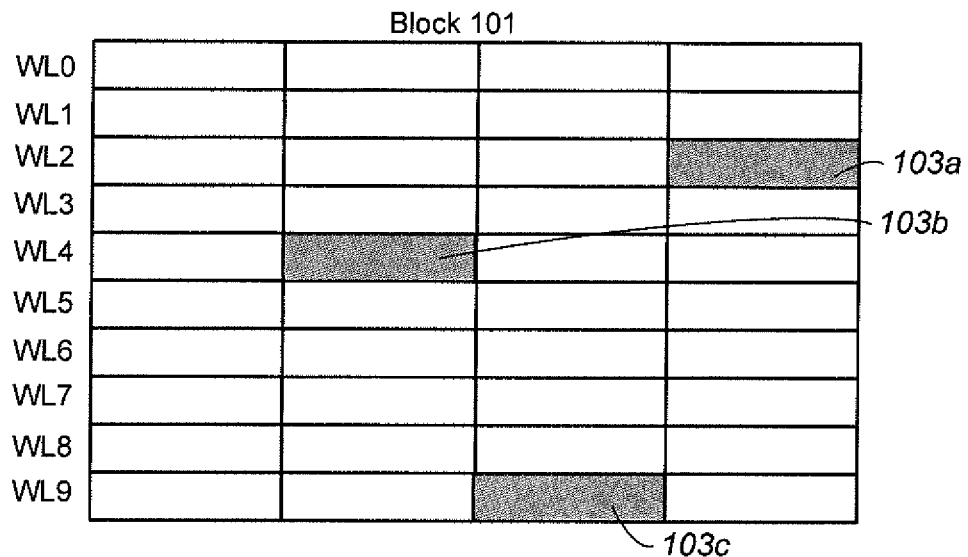
FIG. 11 shows physical units in a block.

FIG. 11 illustrates a portion of a block (word lines WL0-WL9 of a block that may contain any number of word lines). Each word line is shown as containing four physical units. Each such physical unit may have a capacity to store one ECC codeword (i.e. the amount of data that is individually encoded and decoded by the ECC scheme of the memory system). When data is read out, an ECC engine may decode data from each physical unit prior to sending the data to a host. The ECC engine may determine an error rate (e.g. number of bad bits, or flipped bits) for each physical unit when decoding. A few physical units may have high error rates compared with other physical units. FIG. 11 shows three physical units 103$a$-$c$ with high error rates (shaded). An error rate may be considered "high" if it is above a certain level which may be a predetermined level across all blocks throughout the life of the product or may be a variable level, e.g. a level established in relation to other physical units such as an average error rate for physical units in the block, or in a die, or other unit.

Figure 12:
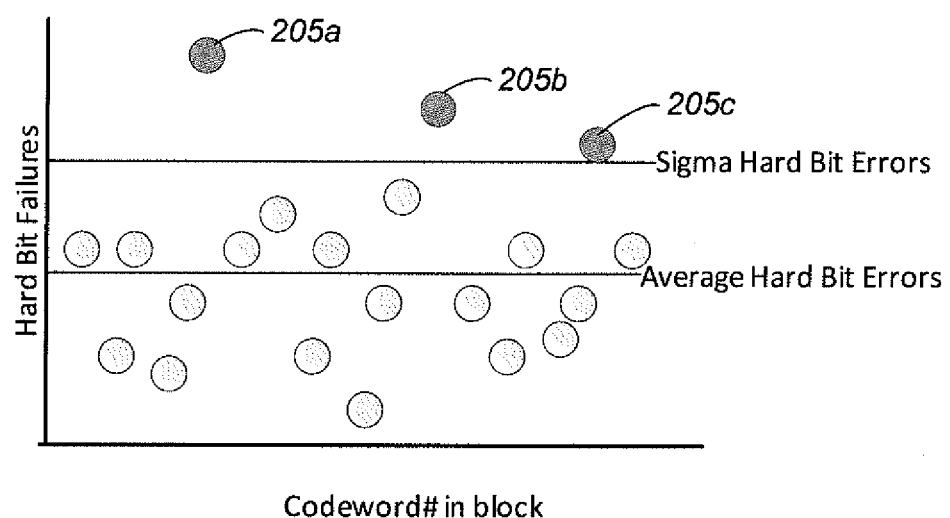
FIG. 12 shows error rates for physical units of a block.

FIG. 12 shows error rates for data in block 101 of FIG. 11. Three ECC codewords 205$a$-$c$ corresponding to the three physical units 103$a$-$c$ have high error rates, which in this example means a number of hard errors that is more than one sigma (one standard deviation) greater than the average for the block. An error is generally considered a hard error if the corresponding cell memory state is not close to a boundary with another memory state. Soft errors occur when the corresponding cell memory state is close to such a boundary and is thus recognized as likely to be flipped. Hard errors are generally more problematic because a high resolution read indicates that they are not likely to be flipped. Hard errors may be more indicative of physical defects that could cause a large change in cell threshold voltage.

While this example refers to hard errors which may require some high resolution read, in other cases, error rates may be obtained from a simpler read in which soft and hard errors are not distinguished. While error rates in this example are compared to an average for the block, in other cases, error rates may be compared with a fixed number, or an average for a plane, die, or other unit. Any suitable metric may be used to identify high error rate blocks. In some cases a block is logged because of the distribution of errors rather than the average. For example if some physical units within a block show particularly high error rates then error logging may be appropriate. A large standard deviation in error rates across physical units of a block may be used as a metric to initiate error logging because it indicates that some physical units have error rates far from the average.

Data from a physical unit may have a high error rate for a number of reasons. Some high error rates result from transient conditions so that the next time the block is used (i.e. after the block is erased and new data is written) the physical unit may no longer have a high error rate. Some high error rates result from persistent conditions (e.g. physical defects) so that the same physical unit, or units, tend to produce high error rates repeatedly (a persistent error). In order to avoid discarding physical units unnecessarily because of transient conditions, it may be desirable to distinguish between physical units with transient errors (which generally should not be discarded) and physical units with persistent errors (which generally should be discarded).

In some cases, error rates from ECC decoding may give an indication of which physical units produce persistent errors and are likely to be affected by a physical defect. By keeping a log of error rates over multiple write-erase cycles, physical units that repeatedly produce high error rates may be identified so that they may be discarded.

FIG. 13A shows an empty (unwritten) block 311 that contains a physical unit 313 that contains a physical defect that is sufficient to cause persistent errors ("PE"). The physical defect may be present from manufacturing or may develop later (grown defect).

FIG. 13B shows block 311 immediately after data is written. Some data may have a high error rate as written (e.g. because of programming error, or effects of programming adjacent memory cells) as illustrated by physical unit 315.

FIG. 13C shows block 311 after data has been stored for a period of time, at a time when data of the block is being compacted (i.e. valid data is copied out of the block to recover space occupied by obsolete data). Because data has been stored for a period of time some physical units have data retention ("DR") related errors and programming has caused some physical units to develop program disturb ("PD") errors (physical units 317a-d). These are transient errors ("TE"). Other errors may also be caused by other effects. As data is copied as part of the compaction operation (indicated by circled areas with arrows) the data is corrected by the ECC engine. Not all data is copied during compaction (e.g. obsolete data is not copied). FIG. 13C shows physical units 313, 317a, 317b, 317d, and 319a-b being copied. Any errors in obsolete data are not detected because the obsolete data is not read (e.g. physical units 315 and 317c are not copied).

FIG. 13D shows the block after an erase operation and subsequent writing of a log ("Log 1") that records physical areas with high error rates from the first write-erase cycle of FIGS. 13A-C. In this case, the error log records high error rates for areas 313, and 317a, 317b, and 317d. No error log entries are needed for physical units 319a-b because error rates for these units are low. At this point (after just one complete write-erase cycle) there is generally insufficient information to distinguish between transient and persistent defects.

FIG. 13E shows the block after more data is programmed and stored for a period of time, at a time when data is being compacted. As before, some data has developed errors. Data from physical units 315, 317b, 317c, 321, and 323 is being copied in this example. Physical units 313, 317a-b, and 317d that were identified previously as having high error rates are subject to additional reads (e.g. high resolution read). Data from physical units 317a, 317b, and 317d is found to have low error rates so that the previous errors in these areas may be considered transient errors and physical units 317a, 317b, and 317d may be considered acceptable. Logging error rates for these areas may cease because a determination has been made that the errors were transient. Data from physical unit 313 is found to have a high error rate which may be considered a persistent error and physical unit 313 may be considered to produce persistent errors (e.g. because of a physical defect). Physical unit 317c may be monitored further because it has elevated error rates that merit monitoring but not high enough to justify discarding the physical unit. A physical unit may be monitored for any number of cycles in this way (though the log may only record the most recent error rates). Accordingly, physical unit 313 may be discarded (no longer used for storage of user data). Additional physical units may also have error rates determined and some (e.g. physical unit 315) are found to have high error rates and error logging for such physical units may be initiated.

FIG. 13F shows the block after erase and storage of an updated error log ("Log 2") that contains data from the second write-erase cycle of FIGS. 13D-F in addition to the first write-erase cycle. The updated error log may record error rates for physical units 315, 323, and 317c. Defective physical unit 313 may be recorded in a list of unusable physical units. No error logging is performed for such defective physical units because they are discarded and not used for subsequent storage of user data.

In the example of FIGS. 13A-F, a physical unit that produces a high error rate in two successive write-erase cycles may be designated as a bad unit (e.g. physical unit 313) or may be further monitored (e.g. physical unit 317c). In other cases, error rates may be logged over more write-erase cycles before such a determination is made. Accordingly, a log may be sufficiently deep to accumulate error rates from enough successive cycles so that a determination may be made from the recorded error rates in the log.

FIG. 14 shows an example of an error log 421. Error log 421 is maintained in the form of a table that is stored at a predetermined location within the block to which it refers (e.g. at the start of the block). An error log may be copied out of a block (e.g. to RAM) prior to erase and may be written back into a block after it is erased. Each row of error log 421 corresponds to an individual read operation (Read 0-2). Error log 421 of FIG. 14 includes data from three read operations (the three most recent reads). Other error logs may contain data from any number of read operations so that decisions regarding which errors are persistent may be based on a suitable amount of data. Each column of error log 421 contains recorded error rates for a particular physical unit (Units A, F, K, and X). In this example, error rates are maintained for four physical units in a block that may contain many physical units. However, error logs may track any number of physical units. In some cases, all physical units in a block may be tracked in this manner. In other cases, to reduce overhead, the number of physical units tracked may be limited to a few outliers with error rates above a certain level. Blocks with low error rates may not track any physical units and no log may be maintained in such blocks. Physical units F and K have three entries each so that there may be sufficient data to make a determination regarding these physical units (unit F had a high error rate in read 0 but had low errors in reads 1 and 2 indicating a transient error while unit K is consistently high and may be considered bad or require further monitoring depending on the threshold).

Error logs may be maintained for all blocks in a nonvolatile memory system, or for only some blocks. In general, if a block shows an overall error rate that is relatively low (e.g. average error rate for the block is low) then there may be no reason to maintain an error log for this block. When a block shows a high or increasing number of errors, or a widening distribution of error rates, or some other metric indicating problematic physical units, then an error log for the block may be initiated. This reduces overhead and limits error logs to blocks that are likely to benefit from the data provided by the error logs. In particular, if a block has a high or increasing error rate, an error log may indicate if errors are due to the same physical units during each cycle (persistent errors). If such units are identified and discarded then the overall error rate of such a block may be significantly reduced thus reducing the time and resources necessary for correction, avoiding data becoming UECC, and avoiding a situation where the overall error rate of the block results in the block being discarded. Bad physical units may be recorded in a separate portion of the error log, or may be recorded elsewhere, e.g. outside the block.

Identifying a particular physical unit as a persistent source of errors may be based on data aggregated over any suitable number of cycles. Cumulative data from multiple cycles may be analyzed in various ways. For example, an average error rate above a threshold number (over a sample number of cycles), an error rate that is consistently above a threshold number (over the sample number of cycles), an increasing error rate, or other factors based on the cumulative data, or some combination of these or other factors may indicate that a physical unit is a bad physical unit.

In some cases, all physical units of a block are read during a read operation (e.g. sequential read operation during a post-write read operation, or garbage collection operation) while in other cases, only a subset of physical units are read (e.g. in response to a host read command that specifies data that occupies only a subset of physical units). Error rate data from either type of read operation may be used for logging purposes and it is not necessary to read all physical units in order to perform logging. If error rates for a particular physical unit are being logged and the physical unit is not read during a particular cycle (e.g. data is written but becomes obsolete before it is read) then no entry is recorded for the physical unit for that cycle. A validity mask may be recorded in the log to indicate which physical units were read in a given cycle (if fewer than all physical units of the block).

Testing

In some cases, it may be desirable to test particular physical units by writing test data to such units (e.g. writing data that is not user data but is specifically for test purposes). Test data may be arranged in a pattern that is known to provide higher error rates than random data. Test data may then be read using a conventional read scheme or a read scheme that provides additional information (e.g. a high resolution read). Such testing may provide additional information regarding a physical unit that is suspected of being a source of persistent errors. Where a physical unit has a high error rate it may be desirable to test the physical unit in this way rather than risk writing user data in the physical unit (where it could become UECC). Testing may be done at a suitable time where it does not impact performance.

Testing may also provide data from a particular physical unit at a time when the physical unit would not otherwise be read. Thus, a suspicious physical unit that would not normally be read in a particular write-erase cycle may be subject to testing to ensure that data is gathered to allow a determination to be made regarding the physical unit. In some cases obsolete data is read from a physical unit to gather error rate data in a cycle where no such data would otherwise be available.

Error Logging Examples

One example where error logging may be used is when a block is subject to Post Write Read (PWR) or Enhanced PWR (EPWR). Such a block may contain MLC data that is also stored in SLC format outside the block (e.g. in two SLC blocks). The SLC and MLC copies are read and compared at some time after writing (post write) to determine if they are substantially the same. If the number of errors (number of bits that are different between copies) exceeds a threshold number then the MLC copy may be discarded (it is generally assumed that errors are in the MLC copy and that the SLC copy is substantially error-free). In general, EPWR includes reading all data from a block (a sequential read) and is performed as a background operation so that combining error logging with an EPWR operation may be convenient.

Figure 15:
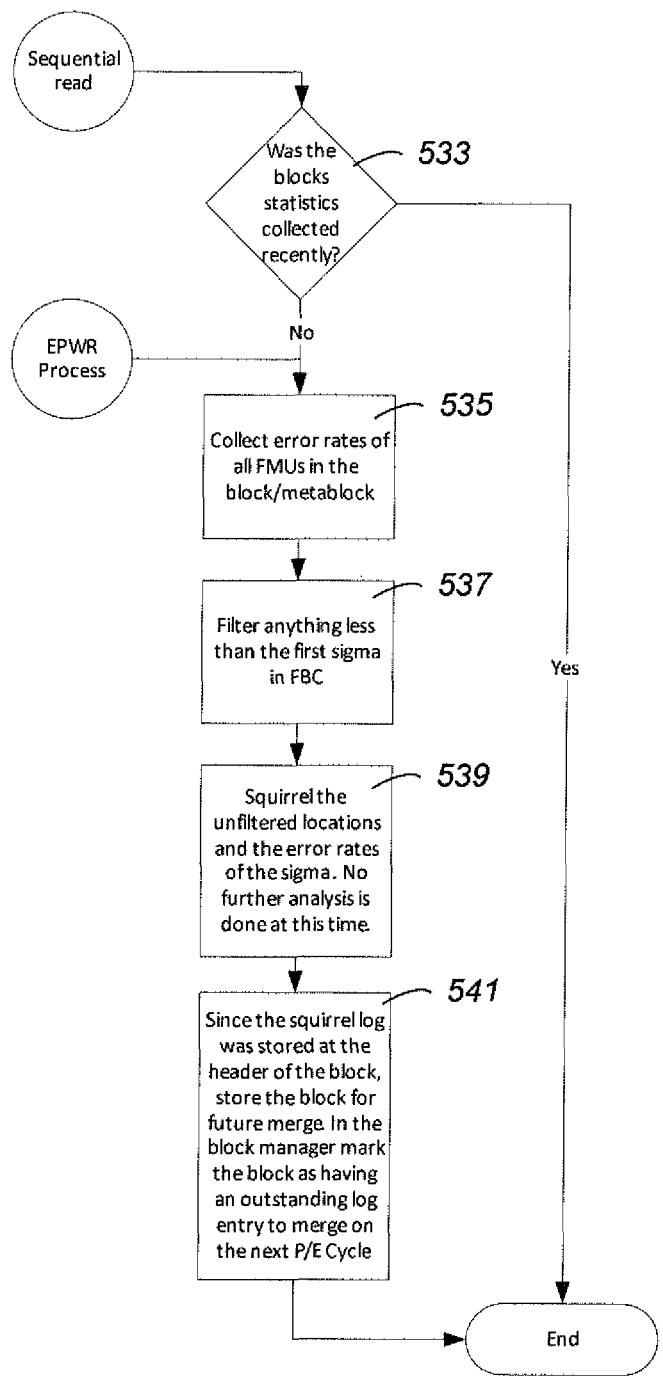
FIG. 15 illustrates error logging during EPWR.

FIG. 15 illustrates steps in an EPWR scheme with error logging. Prior to a sequential read a determination is made as to whether error rate statistics for the block have been collected recently 533. If they have been recently collected (e.g. since the last erase operation) then there is no need to collect additional error rate statistics and the operation terminates. If error rate statistics have not recently been collected then when an EPWR process is initiated, error rates of all physical units (Flash Management Unit, or "FMU", in this example) in the block are collected 535. The error rates are filtered so that only physical units with high error rates have their error rates recorded 537. In this example, physical units with a number of flipped bits (Flipped Bit Count, or "FBC") that is more than one sigma (one standard deviation) greater than the average FBC of the block may be considered to have high error rates (other criteria may also be used to distinguish what is a "high" error rate). The error rates for the physical units that were not filtered out (i.e. for the physical units with high error rates) are stored away ("squirreled") for later reference 539. Since the block is fully written at this point, including a previous version of the error log (or "squirrel log") these error rates are not stored in the block immediately but are stored elsewhere and an indicator (e.g. a flag) is set to indicate that the error rates are to be merged with the previous version of the error log (e.g. they are to be added as a new row in the error log when it is next written in the block) 541.

Figure 16:
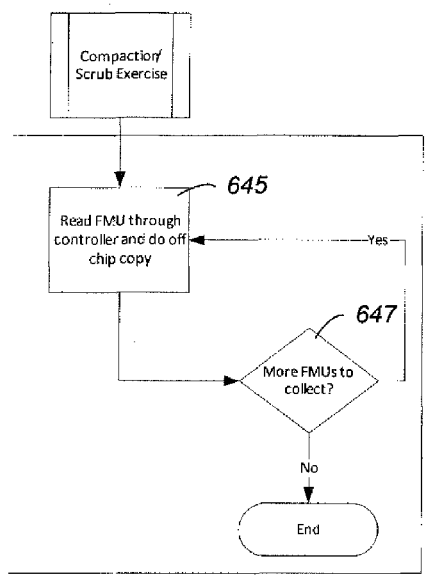
FIG. 16 illustrates steps in a compaction/scrub operation.

FIG. 16 shows an example of a compaction/scrub operation in which data in a block is compacted (i.e. valid data only is copied to another location) and scrubbed (ECC correction is performed so that copied data is scrubbed of errors). Because compaction/scrub operations are generally carried out as background operations, combining error logging with compaction/scrub operations may be convenient. Data of a particular physical unit (an FMU in this example) is read out from a memory chip thorough a controller chip 645 where ECC correction is performed and then written back to a different location in the memory chip (off-chip copy). This is repeated for all physical units of the block 647.

Figure 17:
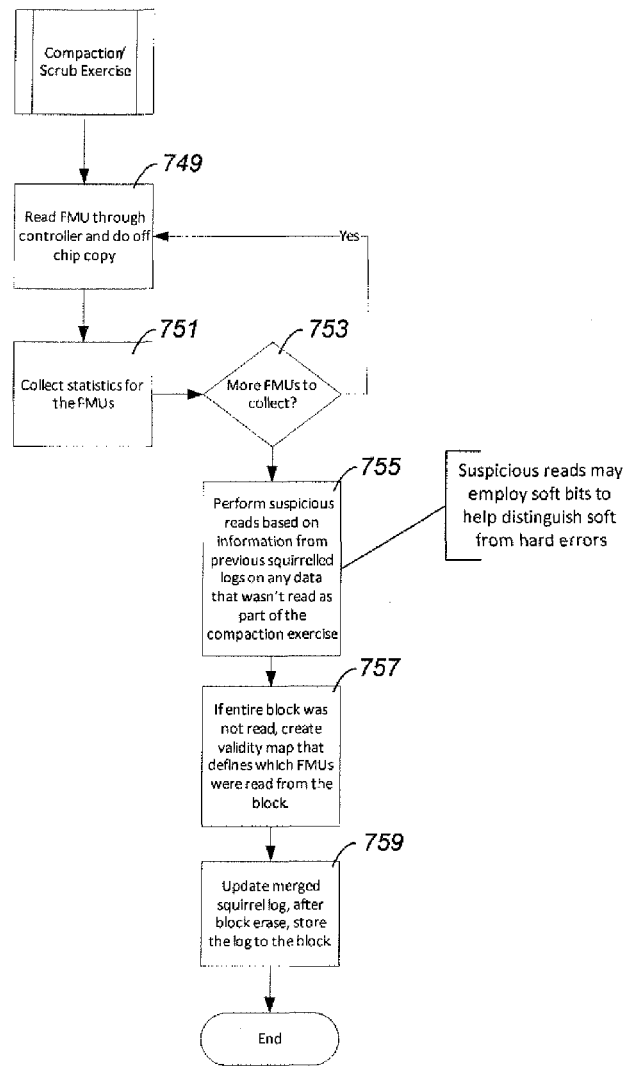
FIG. 17 illustrates steps in a compaction/scrub operation with error logging.

FIG. 17 shows how error logging may be combined with compaction/scrub. As ECC correction is performed on data from the block 749, error rate data is collected for each unit as it is corrected 751. When the compaction/scrub operation is complete 753 additional reads are performed on certain unread physical units (e.g. physical units containing only obsolete data) that are identified as suspicious based on previously recorded error data 755. Such additional reads may use a conventional read scheme or may be high resolution reads that distinguish between soft and hard errors. If less than the entire block has been read (e.g. compacting a partially obsolete block) then a validity map may be created to indicate which physical units were read 757. Subsequently, after the physical block is erased, the updated error log ("merged squirrel log") containing the newly collected error rate data (and validity map if applicable) are stored at a predetermined location in the block (e.g. at the start of the block) 759.

Figure 18:
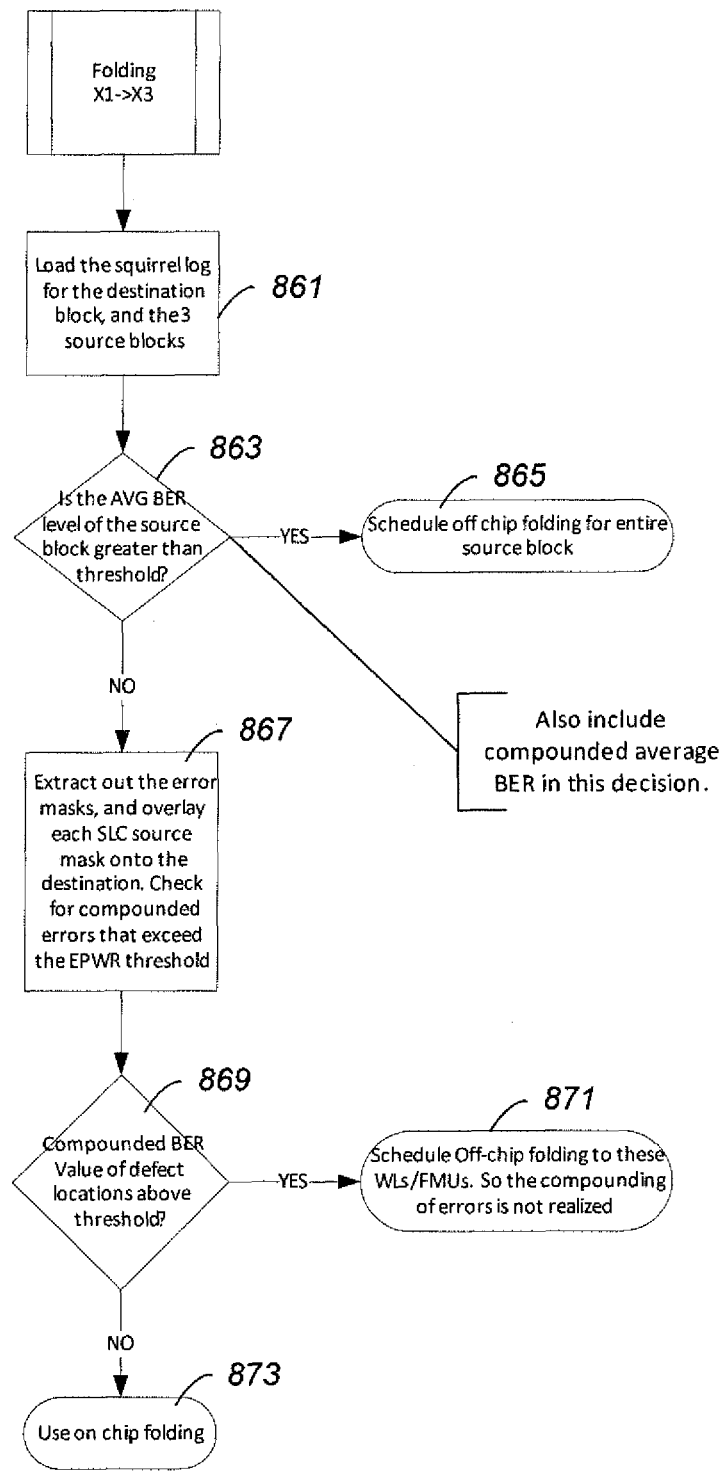
FIG. 18 illustrates steps in a folding operation.

FIG. 18 shows how error logging may be combined with folding data from a low density format into a high density format. For example, data stored in SLC format may be folded into MLC format, or data in a low density MLC arrangement may be folded into a high density MLC arrangement. In the example of FIG. 18, three SLC blocks (X1) are folded into one MLC block (X3). The SLC blocks containing the data to be folded are identified and an MLC destination block is identified. Error logs for the SLC source blocks and the MLC destination block are read 861 and a determination is made for each SLC block as to whether the block's average Bit Error Rate (BER) is greater than a threshold 863. A determination may also be made as to whether the average of all three SLC source blocks exceeds a threshold. If an individual block has a BER above the threshold then it may be scheduled for off-chip folding 865. This means that data is transferred from the SLC source block in the memory chip to the controller chip, where it is subjected to ECC correction, prior to being written in the destination MLC block. Thus, data from an SLC source block with high errors is scrubbed during folding. If the error rate for the block is not greater than the threshold then the locations of physical units with high error rates in the source block are compared with the locations of physical units with high error rates in the destination block. Error maps (error masks) may be compared to see if there is overlap 867. Such overlap may cause data with a large number of errors from an SLC source block to be copied to an area of the MLC destination block that further increases the number of errors thereby compounding the errors. The error rates from the respective error logs of the SLC source block and MLC destination block may be compared to check if the compounded error rate is above a threshold 869. If the compound error rate exceeds the threshold then the data from the identified physical units of the SLC source block may be copied to the destination MLC block via off-chip folding 871 (i.e. with ECC to reduce or eliminate any errors prior to writing in the MLC destination block). In this way errors in the data are not compounded. This off-chip copying is selective and other data from the SLC source block that is not from a physical unit tracked by the error log may be copied by on-chip folding 873 which is generally faster because the data is not sent through the memory bus (which may be busy) and is not corrected by ECC. If the compound BER is not above the threshold then all data may be copied using on-chip folding. Thus, off-chip folding is used selectively to avoid compounding errors where there is a risk that such errors would be significant. Faster on-chip folding is used where there is less risk.

Figure 19:
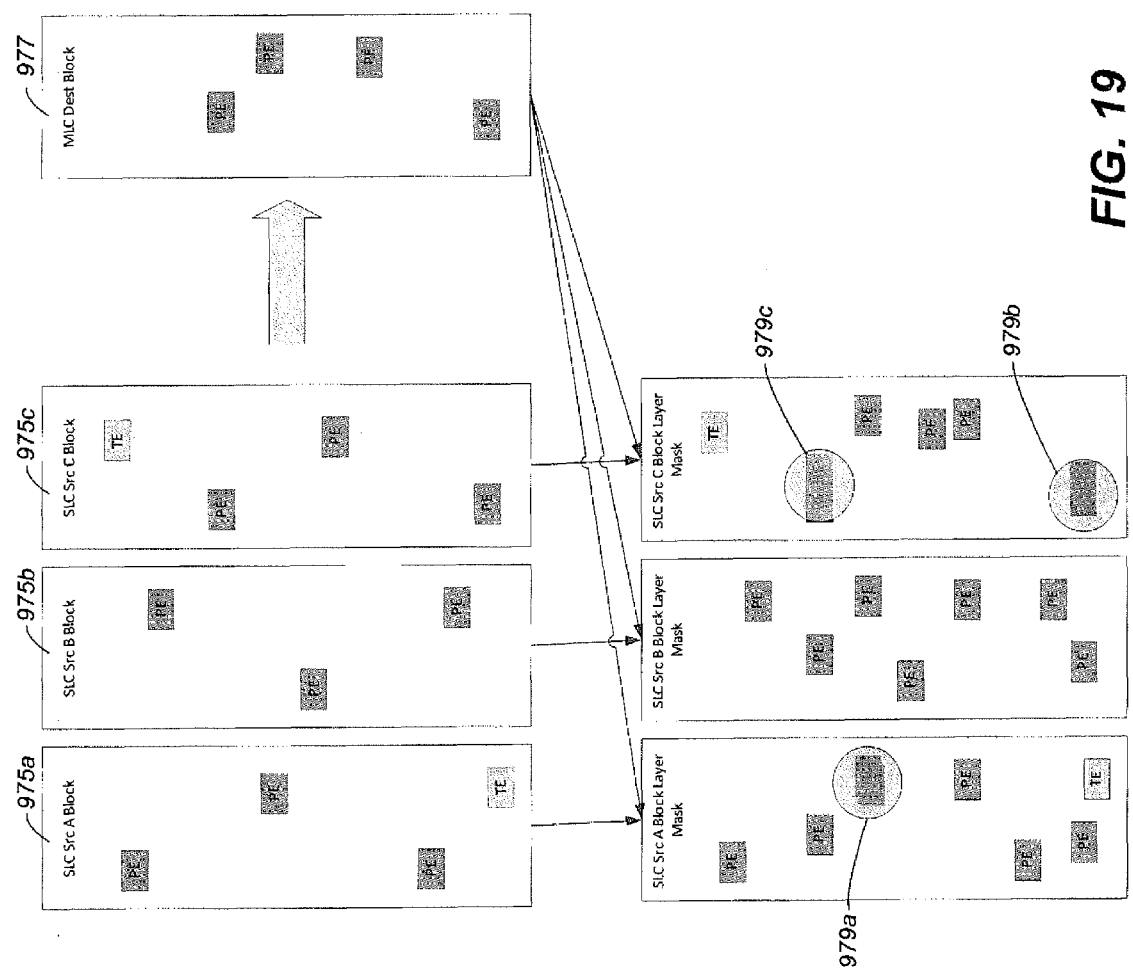
FIG. 19 illustrates error map comparison in a folding operation.

FIG. 19 shows an example of how maps from error logs of SLC source blocks 975a-c may be compared with the error map of an MLC destination block 977 (e.g. step 867 of FIG. 18). Maps 975a-c of errors from source blocks show locations of physical units for which data is recorded in the block's error log. Any physical unit that has been designated as a bad unit is not included as such units are mapped out and no user data is stored in them. The nature of the errors may not be established at this point (i.e. no determination has yet been made as to whether the errors are transient or persistent, or as to whether the physical unit should be discarded or not). Each source error map is overlaid with the destination error map 977. Where error maps overlap at locations 979a-c, this indicates that data is to be copied from a suspect physical unit in a source block to a suspect physical unit in a destination block. Such data in source blocks may be considered as candidates for off-chip folding (additional analysis may be performed to determine if on-chip or off-chip folding is appropriate). This prevents errors from source being compounded by being stored in areas of the destination block where the data would be further degraded.

Figure 20:
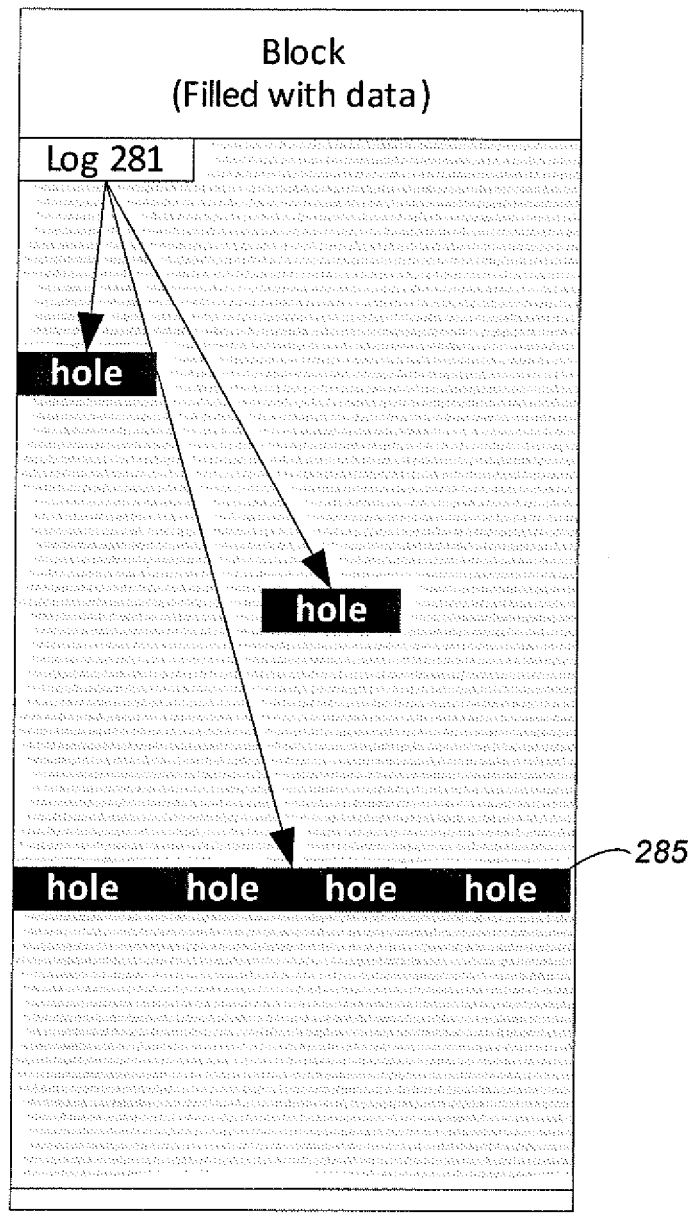
FIG. 20 illustrates a map of bad physical units in a block.

In addition to storing error rate data on particular physical units over a number of cycles, a log may be used to store data regarding defective physical units (e.g. physical units with persistent errors identified by error logging). Such physical units are not used for storage of user data and the memory system generally tracks their locations so that no access is allowed to these locations. FIG. 20 shows an example where a combined log 281 (error log and bad unit list) is maintained. Log 281 indicates the locations of bad physical units, which may be referred to as "block holes" or simply "holes." In some cases, dummy data may be written in such physical blocks in order to avoid unwritten areas in a written block (which could affect data in written areas). Dummy data is not user data and may be written using a simplified write scheme (e.g. large pulses without verification) according to a predetermined pattern (e.g. all cells programmed identically to moderate threshold voltages which may not correspond to any logic state).

One row of such physical units extends across the block indicating a bad word line 285. In some examples, a physical defect may affect two or more physical units in close proximity (e.g. on the same word line). Accordingly, when a physical unit is determined to be bad, additional scrutiny may be applied to physically adjacent physical units.

Identification of bad physical units may be according to the examples described above or may use some other technique. For example, in some cases an erase fail may trigger a word line by word line erase verification. If a particular word line is identified as failing to erase then it may be marked as bad (i.e. all physical units along the word line may be added to the list of bad physical units).

Figure 21:
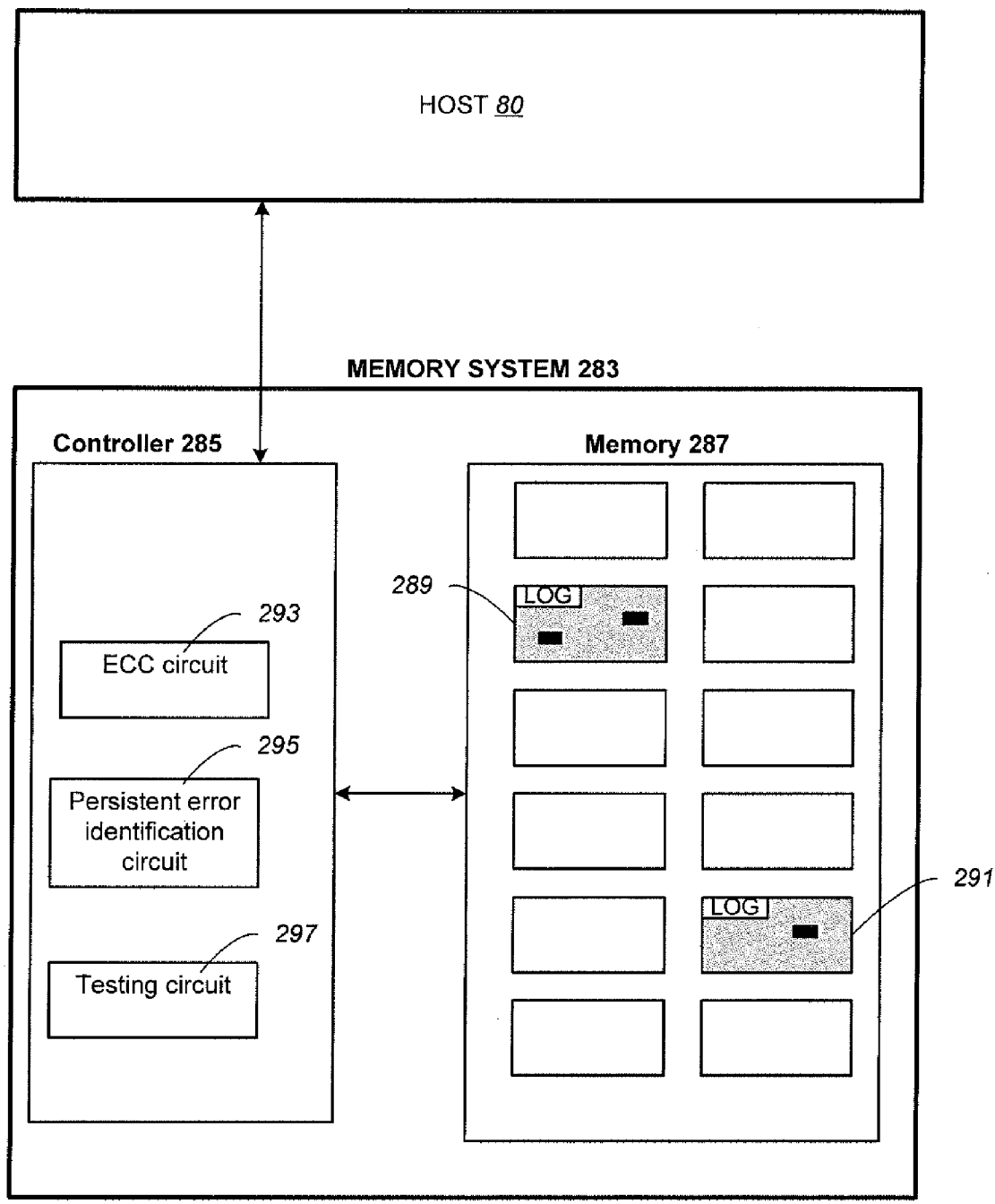
FIG. 21 illustrates an example of hardware.

FIG. 21 shows an example of hardware that may be used to implement aspects of the examples described above. A memory system 283 includes a controller 285 and a memory 287. Memory 287 includes multiple individually erasable blocks including monitored blocks 289, 291. Monitored blocks 289, 291 contain logs that record error rates for one or more physical unit within the respective blocks over multiple write-erase cycles. Other blocks may not contain such logs (e.g. because their overall error rates are low). Controller 285 includes an ECC circuit 293 that can determine the number of bad bits in a portion of data (an ECC word) from a physical unit. A persistent error identification circuit 295 identifies particular physical units as sources of persistent errors based on data logged over multiple write-erase cycles and stored in respective logs. A testing circuit 297 may perform testing on particular physical units in a bloc (e.g. on physical units of monitored block for which error rate data is being logged), for example, by performing a test read and/or test write.

CONCLUSION

The foregoing detailed description has been presented for purposes of illustration and description. It is not intended to be exhaustive or to limit the attached claims. Many modifications and variations are possible in light of the above teaching.

It is claimed:
1. An apparatus comprising:
an individually erasable physical block of nonvolatile memory cells;
a plurality of physical units in the individually erasable block;
an error detection circuit configured to obtain individual error rates for data from the plurality of physical units;
an error log configured to store the individual error rates for the data from the plurality of physical units; and
a persistent error identification circuit configured to identify one or more physical units in the individually erasable physical block as bad and not for subsequent storage of user data while other physical units in the individually erasable physical block that are not identified as bad remain available for subsequent storage of user data, the the persistent error identification circuit configured to aggregate stored individual error rates from the error log over two or more write-erase cycles to identify the bad physical units.

2. The apparatus of claim 1 wherein an individual physical unit has a storage capacity that is equal to the amount of data that is individually encoded and decoded by an Error Correction Code (ECC) scheme of the nonvolatile memory system.

3. The apparatus of claim 1 wherein the error log is configured to store individual error rates only for physical units that have error rates that exceed a threshold value.

4. The apparatus of claim 1 wherein the error log is configured to store the individual error rates by writing the individual error rates in the individually erasable block after erasing the individually erasable block.

5. The apparatus of claim 1 wherein the persistent error identification circuit is further configured to identify one or more additional physical units in the individually erasable block as suspect units by aggregating stored individual error rates of two or more write-erase cycles.

6. The apparatus of claim 5 further comprising a testing circuit configured to perform testing on the suspect units by writing test data and reading the test data.

7. The apparatus of claim 5 further comprising, a folding circuit configured to fold data of the individually erasable block with one or more other individually erasable blocks, the folding circuit configured to determine if the one or more other individually erasable blocks contain suspect units and to ensure that uncorrected data from a suspect unit in the individually erasable block is not folded together with uncorrected data from a suspect unit in the one or more other individually erasable block.

8. The apparatus of claim 7 wherein the folding circuit is connected to an Error Correction Code (ECC) circuit that is configured to perform correction on at least some of the data from suspect units prior to folding.

9. The apparatus of claim 1 wherein the apparatus comprises a plurality of individually erasable blocks of nonvolatile memory cells and the error detection circuit is configured to select the individually erasable block of nonvolatile memory cells for storing the individual error rates in the error log, in response to a determination that the individually erasable block has a block error rate above a limit.

10. The apparatus of claim 9 wherein the error log is configured not to store individual error rates for any physical units in other individually erasable blocks of the plurality of individually erasable blocks that have error rates below the limit.

11. A method comprising:
maintaining individual error maps for each of a plurality of monitored physical blocks in a nonvolatile memory system, an error map for an individual monitored physical block indicating one or more location in the individual monitored physical block that has a high error rate;
identifying two or more monitored physical blocks of the plurality of monitored physical blocks for a block folding operation that copies data from the two or more monitored physical blocks where data is stored in a first format into a destination physical block where data is stored in a second format that stores more data per block than the first format;
analyzing individual error maps for the two or more monitored physical blocks to select a block folding scheme according to the individual error maps from two or more block folding schemes, the two or more block folding schemes including at least: (a) on-chip block folding without Error Correction Code (ECC) correction of data from the two or more monitored physical blocks prior to writing in the destination physical block and (b) off-chip block folding with ECC correction of the data from the two or more monitored physical blocks prior to writing in the destination physical block; and
subsequently performing the block folding operation using the selected block folding scheme.

12. The method of claim 11 wherein on-chip block folding that copies data from the two or more monitored physical blocks in a memory die without sending the data from the memory die over a memory bus and without ECC correction is selected in response to determining that errors for the two or more blocks are not overlapping and that overall error rates of the two or more blocks are below a threshold.

13. The method of claim 11 wherein off-chip block folding with ECC correction is selected in response to determining that errors for the two or more monitored blocks overlap or that overall error rates are above a threshold.

14. The method of claim 13 wherein the error maps for the two or more monitored blocks are updated according to results of the ECC correction.

15. The method of claim 11 wherein the nonvolatile memory system includes unmonitored blocks for which no individual error maps are maintained.

16. The method of claim 15 further comprising: designating a previously unmonitored block as a monitored block in response to a determination that a number of errors in the previously unmonitored block exceeds a predetermined number.

17. The method of claim 11 wherein maintaining the individual error maps includes accumulating error data for the plurality of monitored blocks over a plurality of write-erase cycles and storing each of the individual error maps in corresponding monitored blocks.

18. A system comprising:
a plurality of monitored blocks in a block-erasable nonvolatile memory, the plurality of monitored blocks having error rates above a threshold;
an individual monitored block containing means for recording error data for a plurality of physical areas of the individual monitored block for a plurality of write-erase cycles of the individual monitored block; and
means for identifying physically defective areas of the individual monitored block from the error log.

19. The system of claim 18 wherein the means for recording contains entries for only physical areas of the block that have error rates above a threshold.

20. The system of claim 18 further comprising a plurality of unmonitored blocks having error rates below the threshold.

21. The system of claim 18 further comprising means for testing physical areas of the block for which the error log indicates a high error rate.

22. The system of claim 18 further comprising an Error Correction Code (ECC) circuit, and wherein data is folded from two or more source blocks into a destination block either using or not using the ECC circuit according to a determination based on data in the error logs of the source blocks.

* * * * *